United States Patent [19]

Jerabek et al.

[11] 4,089,643
[45] May 16, 1978

[54] SELF-RESISTANCE-HEATED EVAPORATION BOAT

[75] Inventors: Charles F. Jerabek, Rye, N.H.; Edward D. Parent, Hamilton, Mass.; Harold W. Smith, Portsmouth, N.H.

[73] Assignee: GTE Sylvania Incorporated, Danvers, Mass.

[21] Appl. No.: 668,763

[22] Filed: Mar. 19, 1976

[51] Int. Cl.² .............................................. F27B 14/10
[52] U.S. Cl. ...................................... 432/262; 13/25; 266/275
[58] Field of Search ............... 432/253, 262, 263, 264, 432/265; 220/3.1, 1 B; 13/25

[56] References Cited

U.S. PATENT DOCUMENTS

| 934,374 | 9/1909 | Tomberlin | 220/1 B |
| 2,773,923 | 12/1956 | Smith | 432/262 X |
| 2,996,418 | 8/1961 | Bleil | 13/25 |
| 3,392,970 | 7/1968 | Falk | 432/262 |
| 3,724,996 | 4/1973 | Montgomery | 432/264 |
| 4,015,029 | 3/1977 | Elchisak | 432/262 |
| 4,043,748 | 8/1977 | Watanabe et al. | 432/263 |

Primary Examiner—John J. Camby
Attorney, Agent, or Firm—James Theodosopoulos

[57] ABSTRACT

An elongated, cavity-containing, self-resistance-heated, evaporation boat has a triangular cross-sectional shape at its cavity portion.

6 Claims, 2 Drawing Figures

SELF-RESISTANCE-HEATED EVAPORATION BOAT

THE INVENTION

This invention concerns cavity-containing, self-resistance-heated, evaporation boats used for the vacuum deposition of metals. Examples of such boats are shown in U.S. Pat. Nos. 2,962,538, 2,984,807, 2,996,412, 3,181,968 and 3,452,970.

A cross section of such prior art boats, taken at the cavity, is generally rectangular, although other four or more sided shapes are also disclosed.

In this invention, the cross-sectional shape of the boat taken at the cavity is triangular. The advantages of such a shape are that less material per evaporation area is required to make such a boat and that less electrical power per evaporation rate may be needed.

Figure 1:
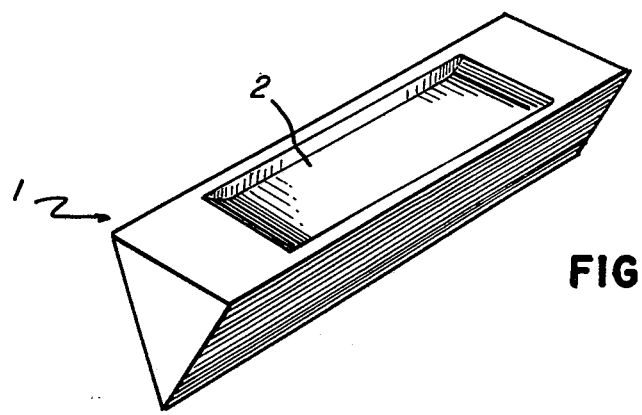
Figure 2:
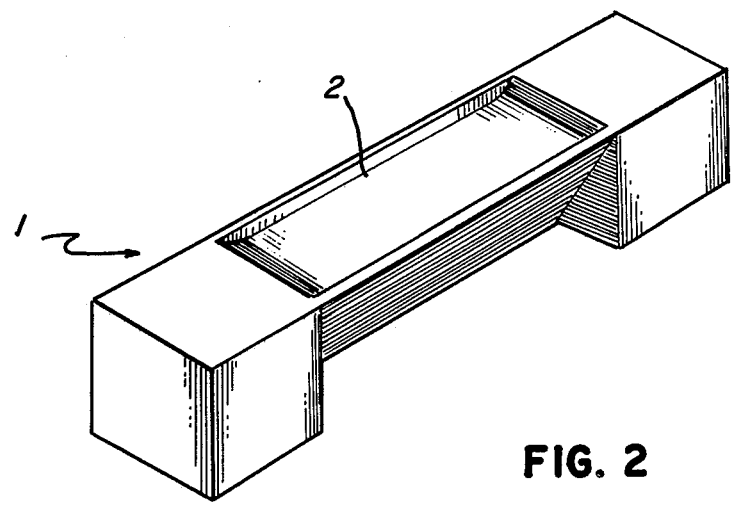

In the drawing, FIGS. 1 and 2 are perspective views of two evaporating boats in accordance with this invention.

As shown in FIG. 1, boat 1 was equilaterally triangular throughout its entire length. Each side of the boat was 21 mm and the boat length was 150 mm. One surface of boat 1 had a cavity 2 thereon, the dimensions of cavity 2 being 100 mm long by 15 mm wide by 1.5 mm deep. Boat 1 could be of any suitable self-resistance-heating composition.

The embodiment shown in FIG. 2 is triangular throughout its cavity portion but has rectangular ends in order to permit use of the boat in existing evaporation equipment without the need of modifying the end clamp apparatus.

A comparison was made of a boat in accordance with this invention versus a prior art boat. Both boats had the same composition consisting of aluminum nitride, boron nitride and titanium boride, as disclosed, for example, in U.S. Pat. No. 3,544,486.

The rectangular boat was 19 mm wide by 13 mm high. Each side of the triangular boat was 19 mm. The boats had the same length.

To heat the boats to a temperature of 1500° C required 4.15 kilowatts of power for the rectangular boat versus only 3.42 kilowatts for the triangular boat.

In the evaporation of aluminum, the rectangular boat required 3.08 kilowatts to maintain an evaporation rate of 0.75 grams of aluminum per minute while the triangular boat required only 2.59 kilowatts to maintain said evaporation.

The cross-sectional shape of a boat in accordance with this invention could also be an isosceles triangle. In such a case the cavity would be preferably located on the unequal face.

We claim:

1. An elongated, cavity-containing, self-resistance-heated, evaporation boat having a triangular cross-sectional shape at its cavity portion, the cross section being taken normal to the long dimension of the boat.
2. The boat of claim 1 wherein the triangular shape extends the entire length of the boat.
3. The boat of claim 1 wherein the ends of the boat have a sour sided shape.
4. The boat of claim 1 wherein said shape is that of an equilateral triangle.
5. The boat of claim 1 wherein said shape is that of an isosceles triangle.
6. The boat of claim 5 wherein said cavity is located on the uneven face of the isosceles triangle.